US008452429B2

(12) United States Patent
Kamath et al.

(10) Patent No.: US 8,452,429 B2
(45) Date of Patent: May 28, 2013

(54) AUDIO PROCESSOR WITH INTERNAL OSCILLATOR-GENERATED AUDIO INTERMEDIATE FREQUENCY REFERENCE

(75) Inventors: Gautham Devendra Kamath, Austin, TX (US); Jeff W. Baumgartner, Austin, TX (US); John Christopher Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 902 days.

(21) Appl. No.: 12/412,936

(22) Filed: Mar. 27, 2009

(65) Prior Publication Data

US 2010/0182062 A1 Jul. 22, 2010

Related U.S. Application Data

(60) Provisional application No. 61/146,296, filed on Jan. 21, 2009.

(51) Int. Cl.
*G06F 17/00* (2006.01)

(52) U.S. Cl.
CPC ...................................... *G06F 17/00* (2013.01)
USPC .......................................................... 700/94

(58) Field of Classification Search
USPC ............ 341/61, 123; 700/94; 369/4; 381/119
See application file for complete search history.

(56) References Cited

U.S. PATENT DOCUMENTS

| | | | |
|---|---|---|---|
| 5,581,617 A * | 12/1996 | Schotz et al. .................... | 381/14 |
| 5,621,805 A * | 4/1997 | Loh et al. ....................... | 381/119 |
| 5,912,596 A | 6/1999 | Ghoshal | |
| 6,301,366 B1 | 10/2001 | Malcolm, Jr. et al. | |
| 6,311,161 B1 | 10/2001 | Anderson et al. | |
| 6,487,573 B1 * | 11/2002 | Jiang et al. .................... | 708/313 |
| 6,670,852 B1 | 12/2003 | Hauck | |
| 6,714,826 B1 | 3/2004 | Curley et al. | |
| 7,057,537 B2 * | 6/2006 | Lee et al. ......................... | 341/61 |
| 7,187,241 B2 | 3/2007 | Hein et al. | |
| 7,257,232 B2 | 8/2007 | Rudolph | |
| 7,330,079 B2 | 2/2008 | Williams, III et al. | |
| 7,339,503 B1 * | 3/2008 | Elenes et al. ..................... | 341/61 |
| 7,809,346 B2 * | 10/2010 | Risbo et al. ................... | 455/296 |
| 2002/0111980 A1 * | 8/2002 | Miller et al. ................... | 708/497 |
| 2006/0273938 A1 * | 12/2006 | Van Den Enden et al. ...... | 341/61 |

OTHER PUBLICATIONS

Texas Instruments MSP430 32-kHz Crystal Oscillators Datasheet; Aug. 2006, revised Apr. 2009.*
Savell, Thomas,"The EMU10K Digital Audio Processor", IEEE Micro, Mar.-Apr. 1999, IEEE Press.
U.S. Appl. No. 11/614,368, filed Dec. 21, 2006, Melanson, et al.

* cited by examiner

*Primary Examiner* — Andrew C Flanders
(74) *Attorney, Agent, or Firm* — Andrew Mitch Harris; Mitch Harris, Atty at Law, LLC

(57) ABSTRACT

An integrated circuit audio processor having an internal-oscillator generated intermediate frequency reference provides for operation of an audio processor without requiring an external master clock. Input audio streams are sample-rate converted to an intermediate sample rate derived from the internal oscillator, which may be an LC oscillator. One or more output audio streams are generated from the one or more input audio streams at the intermediate sample rate and are converted from the intermediate sample rate to corresponding output sample rates. A divider generates the intermediate sample rate from the oscillator output, and is programmed to control the intermediate sample rate to ensure that the intermediate sample rate is in the proper range for operation of the integrated circuit. The divider can be programmed to accommodate changes in process, voltage and/or temperature of the IC, so that the intermediate sample rate is maintained near an expected frequency.

21 Claims, 4 Drawing Sheets

AUDIO PROCESSOR WITH INTERNAL OSCILLATOR-GENERATED AUDIO INTERMEDIATE FREQUENCY REFERENCE

The present U.S. Patent Application claims priority under 35 U.S.C. §119(e) to U.S. Provisional Patent Application Ser. No. 61/146,296, filed on Jan. 21, 2009.

BACKGROUND OF THE INVENTION

1. Field of the Invention

The present invention relates generally to digital audio processing systems, and more specifically, to a digital audio processor including an internal oscillator that provides a reference source that controls an internal intermediate sample frequency of the audio processor.

2. Background of the Invention

Digital audio systems are prevalent in the areas of home entertainment, professional production of multimedia and computer reproduction and generation of multimedia sources. Increasingly, single chip solutions generate and merge multiple streams of audio information. The streams frequently have differing sample rates and may originate as either analog or digital sources. In order to manage such audio processing, a high frequency master clock typically provides the source for various sample clocks that are derived by dividing the master clock. The master clock is typically provided by an external system clock, such as from a crystal oscillator.

Further, the input audio streams are typically provided from different sources having their own reference clock that differ in frequency. Even though the variation in frequency may be slight, due to audio requirements, the streams must still be sample rate converted in order to maintain synchronization over the typically large audio program data lengths. For outputs that must be synchronized to downstream data sinks, the output streams may also require synchronization. For the above reasons, audio processing integrated circuits handling multiple audio streams generally convert all of the incoming audio data to a single intermediate sample rate that is synchronized to the master clock. The output streams are typically generated at the desired output sample rate(s) as derived from the master clock. Use of an intermediate sample rate also eliminates problems with switching synchronization sources. For example, when an audio processor is synchronized to an input sample stream (rather than an independent master clock) and the sample stream clock changes, or is removed, requiring selection/generation of another master clock source, "glitches" in the audio processor outputs will occur.

In some applications, it is desirable to reduce the pin count and the external component count by providing an internal oscillator for an integrated circuit that would ordinarily require an external reference oscillator. A suitable reference oscillator may not be available in the system, or power consumed to distribute a suitably high-frequency reference clock to an integrated circuit may be excessive. Further, electromagnetic interference (EMI) associated with distributing such a reference clock may be unacceptable. While resistor-capacitor (RC) oscillators and inductor-capacitor (LC) oscillators can be implemented within integrated circuits, in audio applications in particular, internal RC oscillators and LC oscillators do not provide sufficient accuracy to serve as digital audio master clock reference sources. In particular, the frequency of such an oscillator will vary with process, voltage and temperature.

Therefore, it would be desirable to provide a digital audio processing integrated circuit with an internal master clock generator that is sufficiently stable and accurate for processing multiple audio input and output streams.

SUMMARY OF THE INVENTION

The above stated objectives are achieved in an audio processing integrated circuit (IC) and its method of operation. One or more input audio streams, which can be digital or converted by an internal analog-to-digital converter from analog sources, are sample-rate converted to an intermediate sample rate derived from an internal high-frequency LC oscillator. One or more output audio streams are generated from the one or more input audio streams at the intermediate sample rate and are converted from the intermediate sample rate to corresponding output sample rates. The output audio stream(s) may also be provided as analog outputs after conversion via an internal digital-to-analog converter (DAC). A divider divides the output of the internal high-frequency LC oscillator to generate the intermediate sample rate.

The divider is programmed to control the intermediate sample rate in order to ensure that the intermediate sample rate is in the proper range for operation of the integrated circuit, for example the intermediate sample rate is maintained at a higher rate than input audio data streams' sample rates, so that higher frequency in-band information is not destroyed by conversion to the intermediate sample rate. The divider can be programmed to accommodate changes in process, voltage and/or temperature of the IC, so that the intermediate sample rate is maintained near an expected frequency. The frequency of the intermediate sample rate can be measured, and the divider adjusted in accordance with the measurement, using a word clock received at one of the digital audio input or output interfaces, and the word clock that is used may be selected by a "winner-take-all" approach, in which the first interface to supply a valid word clock is used to supply the reference used to measure the intermediate sample rate and set the divider to control the intermediate sample rate. Alternatively, the divider value can be factory-programmed by providing the divisor from a one-time programmable (OTP) register.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses audio processing integrated circuits (ICs) and their methods of operation. In the present invention, a high frequency internal inductor-capacitor (LC) oscillator is provided within the audio processor IC and a divider is provided to generate an internal intermediate sampling rate from an output of the LC oscillator. Asynchronous sample rate converters (ASRCs) are provided to convert digital input streams to the internal intermediate sampling rate and to convert digital output streams to the desired audio output rates. To accommodate for variation of the internal LC oscillator frequency with process, voltage and temperature, a calibration may be performed to adjust the division factor of the divider. An externally provided word clock may be used to measure the value of the intermediate sampling rate and adjust the divider to set the intermediate sampling rate.

Figure 1:
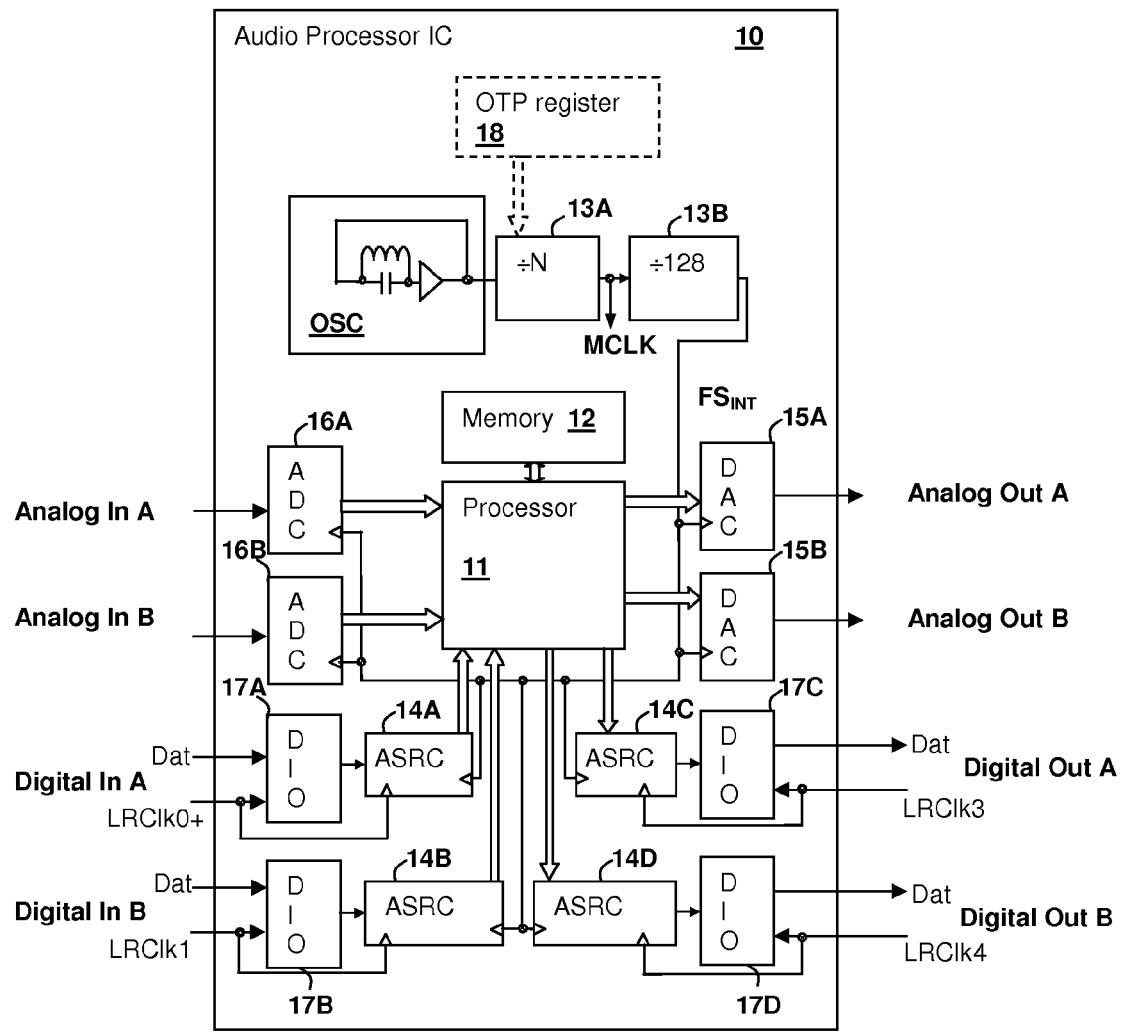
FIG. 1 is a block diagram depicting an audio processor integrated circuit (IC) 10 in accordance with an embodiment of the present invention.

Referring now to FIG. 1, an exemplary audio processor IC 10 in accordance with an embodiment of the invention is shown. An LC oscillator OSC provides a source for a master clock signal MCLK that can be used to operate processing elements such as processor 11, and to generate an internal sampling clock $FS_{INT}$ to which all audio is internally synchronized. A programmable divider 13A generates master clock signal MCLK and a fixed divider 13B generates internal sampling clock $FS_{INT}$ from master clock signal MCLK, so that a fixed relationship is maintained between them. Processor 11 is coupled to a memory 12 that contains program instructions for implementing various audio processing functions, but in alternative embodiments of the present invention, the audio processing functions may be performed by dedicated logic. For example, in mixing functions, multiplier combiners can be used to generate the audio outputs from the audio input sources.

For illustrative purposes, audio processor IC 10 is provided with two analog inputs Analog In A and Analog In B, which are sampled by respective analog-to-digital converters (ADCs) 16A and 16B at a rate determined by internal sampling clock $FS_{INT}$. Audio processor IC 10 is also provided with two digital audio inputs Digital In A and Digital In B, received by digital interfaces (DIO) 17A and 17B, respectively. The data received by DIOs 17A and 17B are independently clocked in at rates determined by externally supplied word clocks LRClk0 and LRClk1, respectively. The outputs of DIOs 17A and 17B are converted by asynchronous sample rate converters (ASRCs) 14A and 14B, respectively, to the rate of internal sampling clock $FS_{INT}$. Processor 11 executes program instructions contained in memory 12 to compute digital audio output streams from the four audio input streams received from inputs Analog In A, Analog In B, Digital In A and Digital In B, for example, by multiplying each of the inputs by a scale factor to generate a set of audio output streams.

Also for illustrative purposes, audio processor IC 10 generates two analog outputs Analog Out A and Analog Out B, which are generated by respective digital-to-analog converters (DACs) 15A and 15B, which are clocked by internal sampling clock $FS_{INT}$. Audio processor IC 10 also generates two digital audio outputs Digital Out A and Digital Out B, at DIOs 17C and 17D, respectively. DIOs 17C and 17D receive outputs of ASRCs 14C and 14D, respectively, which convert the audio stream data from the rate of internal sampling clock $FS_{INT}$ to the rate of externally supplied word clocks LRClk3 and LRClk4, respectively.

Audio processor IC 10, as described above, provides a generalized audio processing system-on-a-chip (SoC) that can generate output analog and digital audio streams from input digital and/or analog streams. Unlike conventional audio processor ICs, audio processor IC 10 does so based on an internally-generated clock signal provided by an internal LC oscillator with the inductive and capacitive elements fabricated on a die along with the other devices depicted in FIG. 1.

LC oscillator OSC provides a harmonically pure, i.e., low-jitter clock source. However, the present invention applies to integrated internal oscillators having lower Q factors and therefore higher jitter. No matter the resonator quality factor and oscillator design, the output frequency of LC oscillator OSC is affected by process variation. The oscillator may also be sensitive to the power supply voltage provided to audio processor IC 10 and the temperature of the die, causing an overall variation of 10% or more in the frequencies of master clock signal MCLK and internal sampling frequency $FS_{INT}$. In order to maintain proper operation of audio processing IC 10 without compensation for the above-described process-voltage-temperature (PVT) variation, internal sampling frequency $FS_{INT}$ must be maintained above the Nyquist frequency of all of the audio streams (twice the highest-frequency audio content). One solution is to raise the nominal oscillating frequency of LC oscillator OSC to a frequency such that for worst-case PVT conditions, the highest Nyquist frequency of the audio stream set is exceeded by internal sampling frequency $FS_{INT}$. However, it is desirable to control the range over which internal sampling frequency $FS_{INT}$ is allowed to vary, as the design of ASRCs 14A-14D can be optimized if the frequency variation is controlled/reduced. Further it is desirable to reduce the frequency of master clock signal MCLK, as higher frequencies for operation of processor 11, memory 12 and other high-speed circuits will result in higher power consumption by audio processor IC 10. While it is possible to tune an LC oscillator by adding switched capacitor banks or varactors, such techniques inevitably reduce the quality factor (Q) of the LC circuit causing additional phase noise (jitter). Such circuits also add significant analog circuit area which does not scale down with process geometry.

Figure 2:
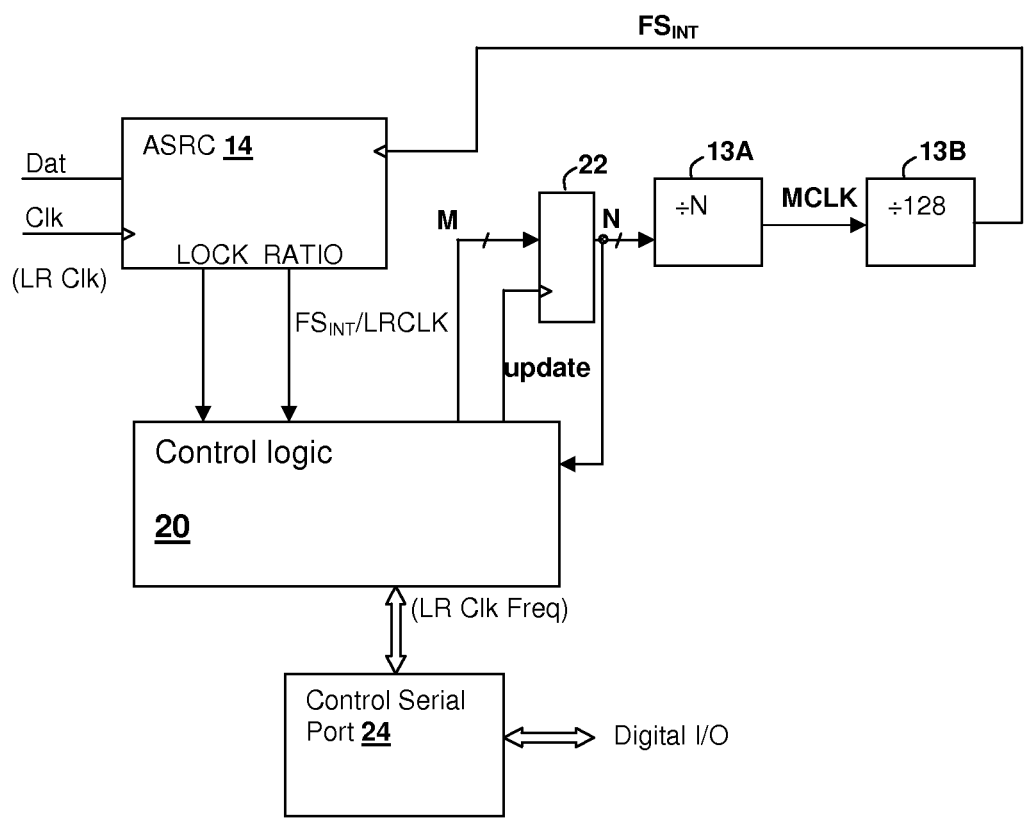
FIG. 2 is a block diagram depicting details of clock control circuits within audio processor IC 10 of FIG. 1 in accordance with an embodiment of the present invention.

In accordance with an embodiment of the invention, the frequency of LC oscillator OSC can be calibrated using an external word clock signal as a reference. Referring now to FIG. 2, clock control circuits within audio processor IC 10 of FIG. 1 are illustrated that are used to perform such a calibration in accordance with an embodiment of the present invention. A latch 22 provides the division factor N to programmable divider 13A, which it receives as a next division factor M from a control logic 20 and latches in response to a control signal update. The output of the divider chain formed by dividers 13A and 13B, which in the example is intermediate sampling clock signal $FS_{INT}$, is provided to an ASRC 14, which may be any of ASRCs 14A-14D of FIG. 1 or another ASRC. ASRCs generally have a value that represents the ratio of the output sample rate to the input sample rate, and in the example, control logic 20 receives such a value RATIO from ASRC 14, and the output sample rate is that of intermediate sampling clock signal $FS_{INT}$. Control logic 20 further receives a lock indication LOCK from ASRC 14.

ASRC 14 receives a wordclock signal LR Clk at the input sample rate to ASRC 14. Control logic 20 receives an indication of what the frequency of wordclock signal LR Clk is expected to be from control serial port 24, which is also part of audio processor IC 10, but not shown in FIG. 1. When lock indication LOCK is asserted, value RATIO provides an indication of the ratio of the frequency of intermediate sampling clock signal $FS_{INT}$ to that of wordclock signal LR Clk, which is used by control logic 20 to correct division factor N, by computing a new next divisor M and asserting control signal update. The computing can be performed by a processor core, which may be processor core 11 of FIG. 1, another core, or the next divisor can be produced via a look-up table or combinational logic. Since the frequency of wordclock signal LR Clk can be expected to fall within a very narrow range of its specified frequency, all of the error between value RATIO and an ideal ratio that can be computed between the expected value of the frequency of wordclock signal LR Clk and an ideal value of the frequency of intermediate sampling clock signal $FS_{INT}$ can be attributed to error in the frequency of LC oscillator OSC. New divisor M can be computed on that basis.

For example, if the ideal value of the frequency of intermediate sampling clock $FS_{INT}$ is 120 kHz and the nominal divisor N is 64, then the frequency of the output of LC oscillator OSC is nominally 983 MHz. If the expected value of the frequency of wordclock signal LR Clk is 96 kHz, the expected value of value RATIO would be 1.25. If the actual value of RATIO produced by ASRC 14 is 1.20, then the frequency of the output of LC oscillator OSC can be assumed lower than the nominal value of 983 MHz by a factor of 1.20/1.25, or 944 MHz, and the actual value of the frequency of intermediate sampling clock $FS_{INT}$ is 115.2 kHz. To correct for the lower frequency values, M can be computed as M=64*1.20/1.25=61.44, which is rounded to the value of 61. The resultant new value of the frequency of intermediate sampling clock $FS_{INT}$ would be 944 Mhz/(128*61)=120.9 kHz, which is much closer to the ideal value of 120 kHz. The computations given above can be implemented in combinational logic or look-up tables, or may be performed by program instructions executed by a processor core. Alternatively, an iterative approach may be taken, in which next divisor M can be adjusted by small increments during calibration.

In some applications, the expected value the frequency of wordclock signal LR Clk can be observed, rather than specified. For example if the frequency of wordclock signal LR Clk takes on easily distinguished values, e.g., 48 kHz, 96 kHz, 192 kHz, then the value of RATIO will never be ambiguous with respect to the actual frequency of wordclock signal LR Clk. However, the frequency of wordclock signal LR Clk must generally be specified to distinguish between closely-spaced possible wordclock frequencies such as 48 kHz and 44.1 kHz, which differ by only 10%, as such variation is generally within the range of variation of frequency of the output of LC oscillator OSC. Also, once the calibration has been performed, the value of N is generally fixed, and further calibration is locked-out, at least while audio is being processed, in order to avoid disturbances in audio processing and sample rate conversion. Since process variation will be compensated for at a single calibration, only temperature and voltage will generally further affect the output frequency of LC oscillator OSC during operation of audio processor IC 10, and further calibration may not be necessary, or may be performed during reset of the audio processor IC 10 or during events coordinated with the external audio system, so that disruption does not occur.

In accordance with an alternative embodiment of the invention, divisor N can be specified by a non-volatile storage, such as a one-time programmable (OTP) register 18 coupled to divider 13A. The value of divisor N can be programmed during the manufacturing process or at system integration by directly measuring the frequency of a signal derived from divider 13A and supplied, at least during measurement, to a pin of audio processing IC 10. The frequency of the output of divider 13A and therefore the frequency of the output of LC oscillator OSC could also be obtained by generating signal at an output of one of DACs 15A-15B, or by probing a die of audio processing IC 10 prior to encapsulation.

Figure 3:
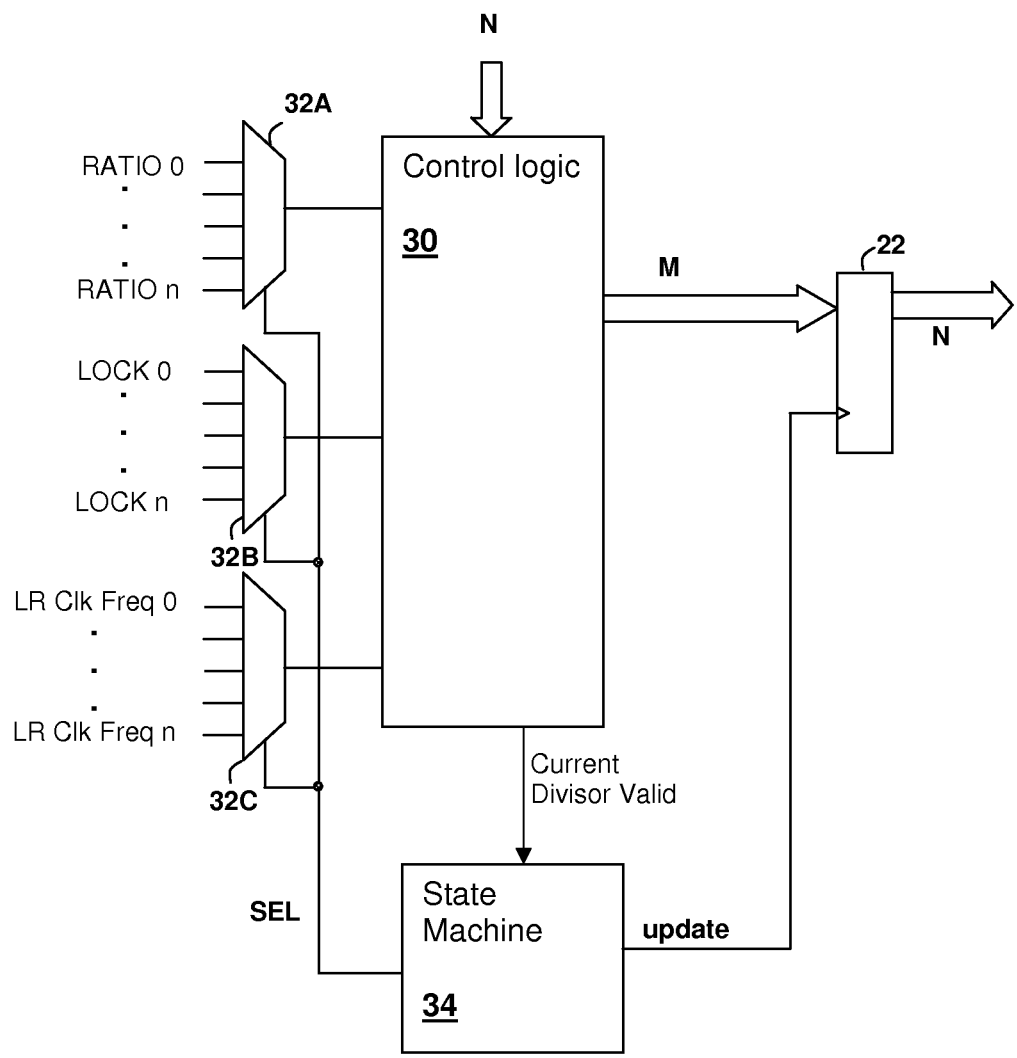
FIG. 3 is a block diagram depicting details of other clock control circuits that may be used in audio processor IC 10 of FIG. 1 in accordance with another embodiment of the present invention.

Referring now to FIG. 3, a clock control circuit in accordance with another embodiment of the invention that may be employed within audio processor IC 10 of FIG. 1 is shown. In the depicted embodiment, a "winner takes all" scheme employing selectors 32A-32C that select between digital audio interfaces is used to find the first "in lock" ASRC for which the value of RATIO and the LR Clock frequency information LR Clk Freq is within reasonable bounds. The selected digital audio information is used to select or compute the value of next divisor M produced by control logic 30. A state machine 34 cycles through the values of RATIO, LOCK and LR Clk Freq as provided for multiple digital audio streams by changing the control input signals SEL that switch selectors 32A-32C until a Current Divisor Valid signal (which may be control signal update) provided from control logic 30 indicates that calibration is complete.

Figure 4:
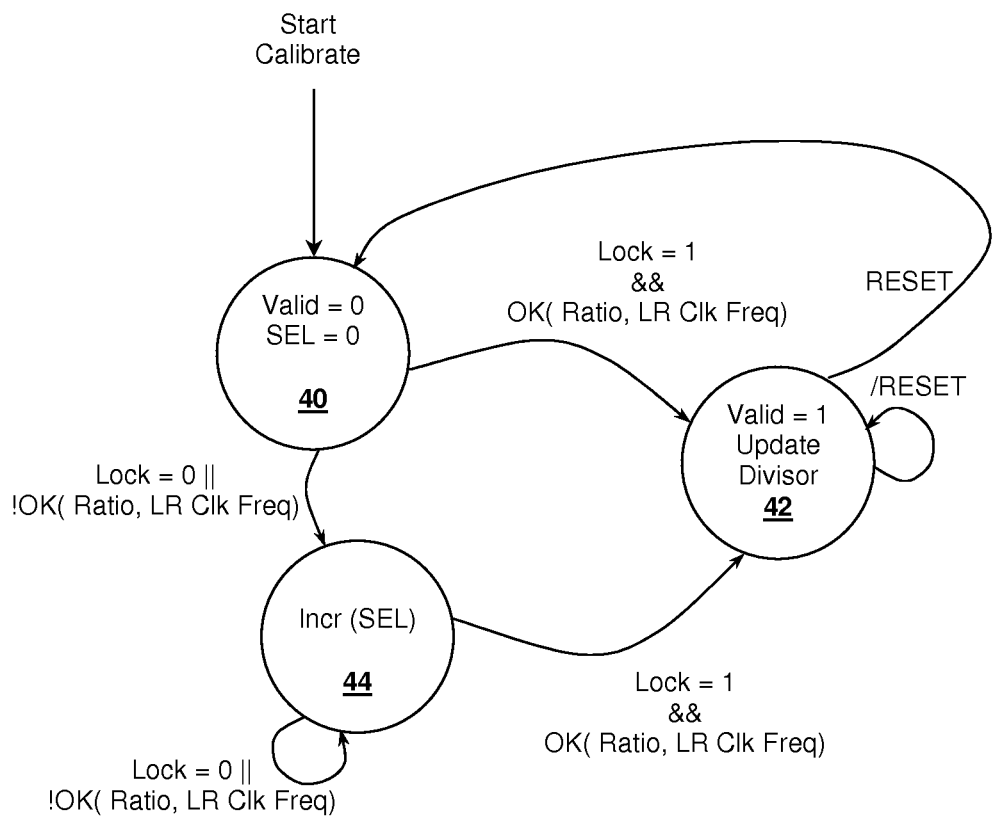
FIG. 4 is a state diagram depicting the operation of the circuit of FIG. 3.

Referring now to FIG. 4, a state diagram illustrating the operation of state machine 34 of FIG. 3 is shown. Upon commencing calibration, which may be in response to power-up, de-assertion of a reset indication RESET or other calibration signal, the Current Divisor Valid signal is de-asserted and the value of select signals SEL is set to zero (state 40). Until the lock indication LOCK for a selected input is true and a reasonable value of the selected ratio value RATIO in combination LR Clock frequency information LR Clk Freq is present, as indicated by the function OK(Ratio, LR Clk Freq), the value of select signals SEL is incremented (state 44). When the lock indication LOCK for the selected input is true and a reasonable value of the selected ratio value RATIO in combination LR Clock frequency information LR Clk Freq is present, the Current Divisor Valid signal is asserted and the value of divisor N is updated (state 42). Until signal RESET is asserted, state 42 is maintained. Upon assertion of signal RESET, state 40 is entered and the calibration is performed again.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An integrated circuit for processing multiple audio streams, comprising:
    at least one input for receiving an input audio stream of the multiple audio streams;
    at least one output for providing at least one output audio stream of the multiple audio streams;
    a first sample rate converter for converting first samples of the at least one input audio stream to an intermediate sample rate;
    a processor for generating second samples of the at least one output audio stream from an output of the first sample rate converter;
    a second sample rate converter for converting the second samples from the intermediate sample rate to generate the at least one output audio stream;
    a oscillator including an inductor and a capacitor forming a resonant tank internal to the integrated circuit for generating a high frequency clock signal; and
    a divider for dividing the high frequency clock signal to generate an internal sampling clock synchronous with the intermediate sample rate for operating the first and second sample rate converters.

2. The integrated circuit of claim 1, wherein divider is programmable for tuning a frequency of the internal sampling clock signal, and further comprising a tuning control logic for programming the divider in conformity with information received at the at least one input or the at least one output.

3. The integrated circuit of claim 2, wherein the tuning control logic programs the divider in conformity with a frequency of a wordclock received at the at least one input or the at least one output.

4. The integrated circuit of claim 3, wherein the wordclock is received at the at least one output, wherein the at least one output is a slave output that receives a wordclock input from an external source.

5. The integrated circuit of claim 3, wherein the wordclock is received at the at least one input.

6. The integrated circuit of claim 3, wherein the divider is programmed during a calibration period during which an indication of the frequency of the wordclock relative to the frequency of the internal sampling clock is determined and used to set a next frequency of the internal sampling clock.

7. The integrated circuit of claim 6, further comprising a selector for selecting from among the multiple audio streams to select the indication of the frequency of the corresponding selected wordclock relative to the frequency of the internal sampling clock.

8. The integrated circuit of claim 2, wherein the divider is programmed during a calibration period during which the information received at the at least one input or the at least one output is used to set the frequency of the internal sampling clock.

9. The integrated circuit of claim 1, wherein the divider is coupled to a non-volatile register that supplies a divisor value to the divider.

10. The integrated circuit of claim 1, wherein the at least one output audio stream comprises multiple output audio streams and wherein the processor generates samples of each of the multiple output audio streams.

11. The integrated circuit of claim 1, further comprising at least one direct input coupled to the processor for receiving third samples of a direct input audio stream at the intermediate sample rate, and wherein the processor receives the third samples without sample rate conversion of the third samples.

12. The integrated circuit of claim 11, wherein the at least one direct input is an output of an analog-to-digital converter that samples an external analog signal received at at least one input terminal of the integrated circuit at the intermediate sample rate and according to the internal sampling clock.

13. A method of processing multiple audio streams within an integrated circuit, comprising:
first receiving an input audio stream of the multiple audio streams;
first generating at least one output audio stream of the multiple audio streams;
second receiving a word clock associated with one of the multiple audio streams;
first converting first samples of the at least one input audio stream to an intermediate sample rate;
second generating second samples of the at least one output audio stream from at least an output of the first sample rate converter;
second converting the second samples from the intermediate sample rate to generate the at least one output audio stream;
third generating a high frequency clock signal from an oscillator having an inductor and a capacitor forming a resonant tank within the integrated circuit; and
dividing the high frequency clock signal to generate an internal sampling clock synchronous with the intermediate sample rate for operating the first and second sample rate converters.

14. The method of claim 13, further comprising determining a division factor for the dividing in conformity with the word clock received by the second receiving, and wherein the dividing is performed in conformity with the division factor determined by the determining.

15. The method of claim 14, wherein the second receiving receives the word clock in conjunction with the at least one output audio stream.

16. The method of claim 14, wherein the second receiving receives the word clock in conjunction with the at least one input audio stream received by the first receiving.

17. The method of claim 14, wherein the determining is performed during a calibration period during which an indication of the frequency of the wordclock relative to the frequency of the internal sampling clock is determined and used to set a next frequency of the internal sampling clock.

18. The method of claim 17, further comprising selecting from among the multiple audio streams to select the indication of the frequency of the corresponding selected wordclock relative to the frequency of the internal sampling clock.

19. The method of claim 13, further comprising supplying a division factor for the dividing from a non-volatile register within the integrated circuit.

20. The method of claim 13, further comprising third receiving third samples of a direct input audio stream at the intermediate sample rate.

21. The method of claim 20, wherein the third receiving receives samples generated by an analog-to-digital converter that samples an external analog signal received at at least one input terminal of the integrated circuit at the intermediate sample rate and according to the internal sampling clock.

* * * * *